US011211587B2

(12) United States Patent
Cheon et al.

(10) Patent No.: US 11,211,587 B2
(45) Date of Patent: Dec. 28, 2021

(54) ORGANIC LIGHT-EMITTING DIODE DISPLAY WITH STRUCTURED ELECTRODE

(71) Applicant: Apple Inc., Cupertino, CA (US)

(72) Inventors: Kwang Ohk Cheon, San Jose, CA (US); Aleksandr N. Polyakov, San Jose, CA (US); Chen-Yue Li, Hsin Chu (TW); Chuan-Jung Lin, Yunlin (TW); KiBeom Kim, Cupertino, CA (US); Nai-Chih Kao, Taoyuan (TW); Rui Liu, San Jose, CA (US); Wendi Chang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/521,837

(22) Filed: Jul. 25, 2019

(65) Prior Publication Data

US 2020/0035951 A1    Jan. 30, 2020

Related U.S. Application Data

(60) Provisional application No. 62/712,124, filed on Jul. 30, 2018.

(51) Int. Cl.
*H01L 51/52* (2006.01)
*H01L 51/50* (2006.01)
(Continued)

(52) U.S. Cl.
CPC ...... *H01L 51/5265* (2013.01); *H01L 51/5056* (2013.01); *H01L 51/5072* (2013.01);
(Continued)

(58) Field of Classification Search
None
See application file for complete search history.

(56) References Cited

U.S. PATENT DOCUMENTS 6,278,237 B1    8/2001   Campos
7,030,553 B2    4/2006   Winters et al.
(Continued)

FOREIGN PATENT DOCUMENTS

CN      1897252 A      1/2007
CN    101091268 A     12/2007
(Continued)

OTHER PUBLICATIONS

Yoon Chang Kim, Far-field radiation of photonic crystal organic light-emitting diode, Optics Express, Aug. 2005, <https://www.researchgate.net/publication/26268788>.

*Primary Examiner* — Khaja Ahmad
(74) *Attorney, Agent, or Firm* — Treyz Law Group, P.C.; Jason Tsai

(57) ABSTRACT

A display may have an array of organic light-emitting diode (OLED) pixels that each have OLED layers interposed between a cathode and an anode. Voltage may be applied to the anode of each pixel to control the magnitude of emitted light. The conductivity of the OLED layers may allow leakage current to pass between neighboring anodes in the display. To reduce leakage current and cross-talk, the thickness of at least one of the OLED layers may be reduced. To maintain the optical cavity of the pixels, transparent optical spacer structures may be inserted. Alternatively, the thickness of the anodes can be increased. To accommodate a common prime layer within the OLED layers, the optical spacers or anodes may be separately patterned to have different thicknesses. Grating structures and photonic crystal structures may be embedded as part of the optical spacers to help control emission at selected viewing angles.

13 Claims, 13 Drawing Sheets

(51) Int. Cl.
  *H01L 51/56* (2006.01)
  *H01L 27/32* (2006.01)

(52) U.S. Cl.
  CPC ...... *H01L 51/5088* (2013.01); *H01L 51/5096* (2013.01); *H01L 51/56* (2013.01); *H01L 27/3246* (2013.01); *H01L 2251/558* (2013.01)

(56) References Cited

U.S. PATENT DOCUMENTS

| | | | |
|---|---|---|---|
| 7,649,196 B2 | 1/2010 | Tischler et al. | |
| 7,710,020 B2 | 5/2010 | Li et al. | |
| 7,948,172 B2 | 5/2011 | Cok et al. | |
| 9,542,892 B2 | 1/2017 | Choi et al. | |
| 10,038,168 B2 | 7/2018 | Harkema | |
| 10,304,906 B2 | 5/2019 | Hack et al. | |
| 10,340,480 B1 | 7/2019 | Peckham | |
| 2004/0027063 A1* | 2/2004 | Nishikawa | H01L 51/5048 313/506 |
| 2006/0138945 A1* | 6/2006 | Wolk | H01L 51/5265 313/506 |
| 2007/0015429 A1* | 1/2007 | Maeda | H01L 51/5206 445/24 |
| 2009/0283786 A1* | 11/2009 | Kobayashi | H01L 51/5265 257/98 |
| 2009/0315452 A1* | 12/2009 | Lim | H01L 27/3211 313/504 |
| 2011/0084257 A1* | 4/2011 | Kwon | H01L 27/3276 257/40 |
| 2011/0241000 A1* | 10/2011 | Choi | H01L 51/5218 257/59 |
| 2012/0205676 A1* | 8/2012 | Seo | H01L 27/322 257/88 |
| 2014/0159007 A1* | 6/2014 | Song | H01L 27/322 257/40 |
| 2014/0175470 A1* | 6/2014 | Yokoyama | H01L 51/5072 257/89 |
| 2014/0295597 A1* | 10/2014 | Sato | H01L 51/5036 438/29 |
| 2015/0187858 A1* | 7/2015 | Wang | H01L 27/3279 257/40 |
| 2015/0311463 A1* | 10/2015 | Park | H01L 51/5064 257/40 |
| 2018/0006095 A1* | 1/2018 | Sakairi | H01L 51/5265 |
| 2018/0062034 A1* | 3/2018 | He | H01L 51/50 |
| 2018/0190738 A1 | 7/2018 | Park et al. | |
| 2018/0315961 A1 | 11/2018 | Wang et al. | |
| 2019/0189969 A1* | 6/2019 | Youn | H01L 27/3223 |

FOREIGN PATENT DOCUMENTS

| | | |
|---|---|---|
| CN | 103887443 A | 6/2014 |
| CN | 103928495 A | 7/2014 |
| CN | 105489781 A | 4/2016 |
| CN | 106449714 A | 2/2017 |
| CN | 106960862 A | 7/2017 |
| CN | 106992266 A | 7/2017 |
| CN | 107093674 A | 8/2017 |
| CN | 107741666 A | 2/2018 |
| JP | 2006100187 A | 4/2006 |
| JP | 2015001635 A | 1/2015 |
| KR | 201806225 A | 6/2018 |
| TW | 201310736 A | 3/2013 |
| WO | 2005074330 A1 | 8/2005 |
| WO | 2017004031 A1 | 1/2017 |

* cited by examiner

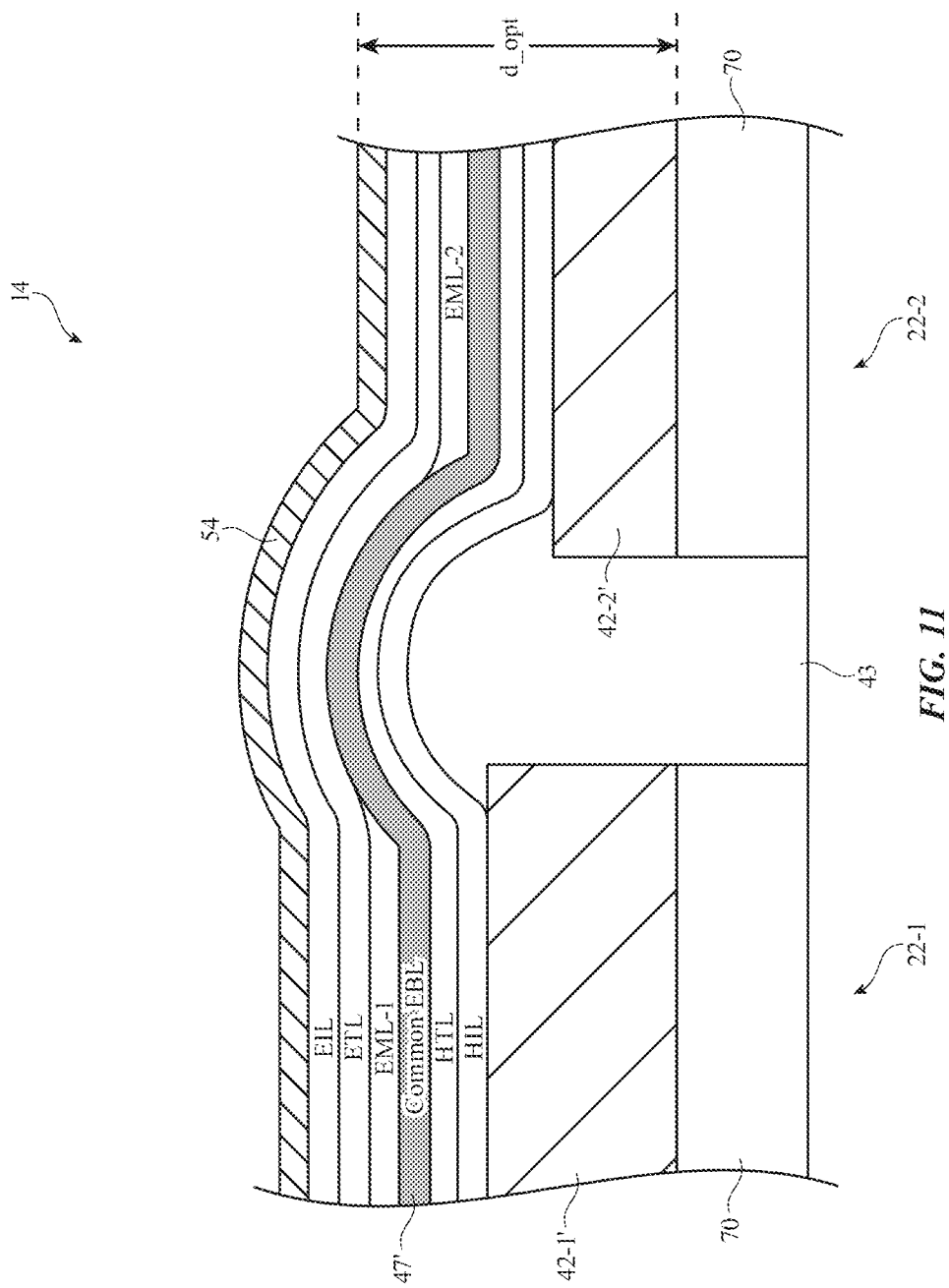

ORGANIC LIGHT-EMITTING DIODE DISPLAY WITH STRUCTURED ELECTRODE

This application claims the benefit of provisional patent application No. 62/712,124, filed Jul. 30, 2018, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

To emit light from a given pixel in an organic light-emitting diode display, a voltage may be applied to the anode of the given pixel. Ideally, the voltage at the anode of the given pixel would not affect any neighboring pixels. However, the conductivity of the OLED layers over the anode may allow lateral conduction from the anode of the given pixel to the anodes of adjacent pixels. This may cause pixel cross-talk that allows nominally 'off' pixels to emit light due to an adjacent 'on' pixel's leakage. The pixel cross-talk may degrade display performance and cause a color-shift in the resulting image.

It is within this context that the embodiments herein arise.

SUMMARY

An electronic device may have a display such as an organic light-emitting diode display. The organic light-emitting diode (OLED) display may have an array of organic light-emitting diode pixels that each have OLED layers interposed between a cathode and an anode.

Each organic light-emitting diode pixel may have a respective anode formed over a reflector layer. Voltage may be applied to the anode of each organic light-emitting diode pixel to control how much light is emitted from each organic light-emitting diode pixel. OLED layers formed above the anode such as a hole injection layer and a hole transport layer may be conductive. The conductivity of the OLED layers may allow leakage current to pass between neighboring anodes in the display.

To reduce leakage current and the accompanying cross-talk in a display, the thickness of at least one of the OLED layers (e.g., a hole transport layer, a hole injection layer, an electron transport layer, an electron injection layer, or other suitable organic layers) may be reduced while the distance between the reflector layer and the top surface of the anode is selected to maintain a predetermined optical cavity distance for the display. In many cases, the OLED display is utilizing optical cavity effects to maximize the performance, so the distance between two reflectors is pre-defined without flexibility. The reflector layer usually has two functions in OLED: to serve as (1) a reflector for cavity effect and (2) an electrode for supplying electric signal. In some embodiments, these two functions are separated or decoupled to have more flexibility in OLED design. Based on this decoupling, the enhancement can be addressed individually without trade-off between tightly bounded two functions, which can help provide electrical improvement to solve cross-talk issues without losing any optical performance.

If desired, the anode of adjacent pixels can be patterned separately using different masks to help accommodate a common electron blocking layer.

In some embodiments, an optical improvement such as structured spacer may be interposed between the reflector and the anode without degrading the electrical performance. The transparent optical spacer may have a thickness selected to provide the predetermined optical cavity distance for the display. If desired, grating structures protruding from the reflector layer into the transparent optical spacer may be provided to enhanced emission at one or more targeted display viewing angles. Alternatively, photonic crystal structures embedded within the transparent optical spacer may be provided to enhance emission at one or more targeted display viewing angles. If desired, the optical spacer of adjacent pixels can be patterned separately using different masks to help accommodate a common electron blocking layer. The transparent optical spacer may also be substituted by a Distributed Bragg Reflector to help enhance the reflectivity of the reflector layer.

BRIEF DESCRIPTION OF THE DRAWINGS

FIG. 11 is a cross-sectional side of an illustrative organic light-emitting diode display showing how the anode layer can be selectively patterned to accommodate a common electron blocking layer in accordance with an embodiment.

DETAILED DESCRIPTION

Figure 1:
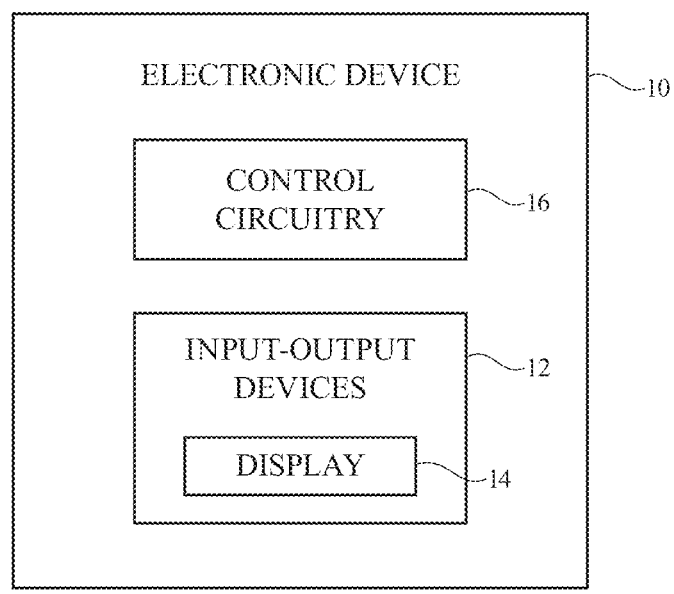
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
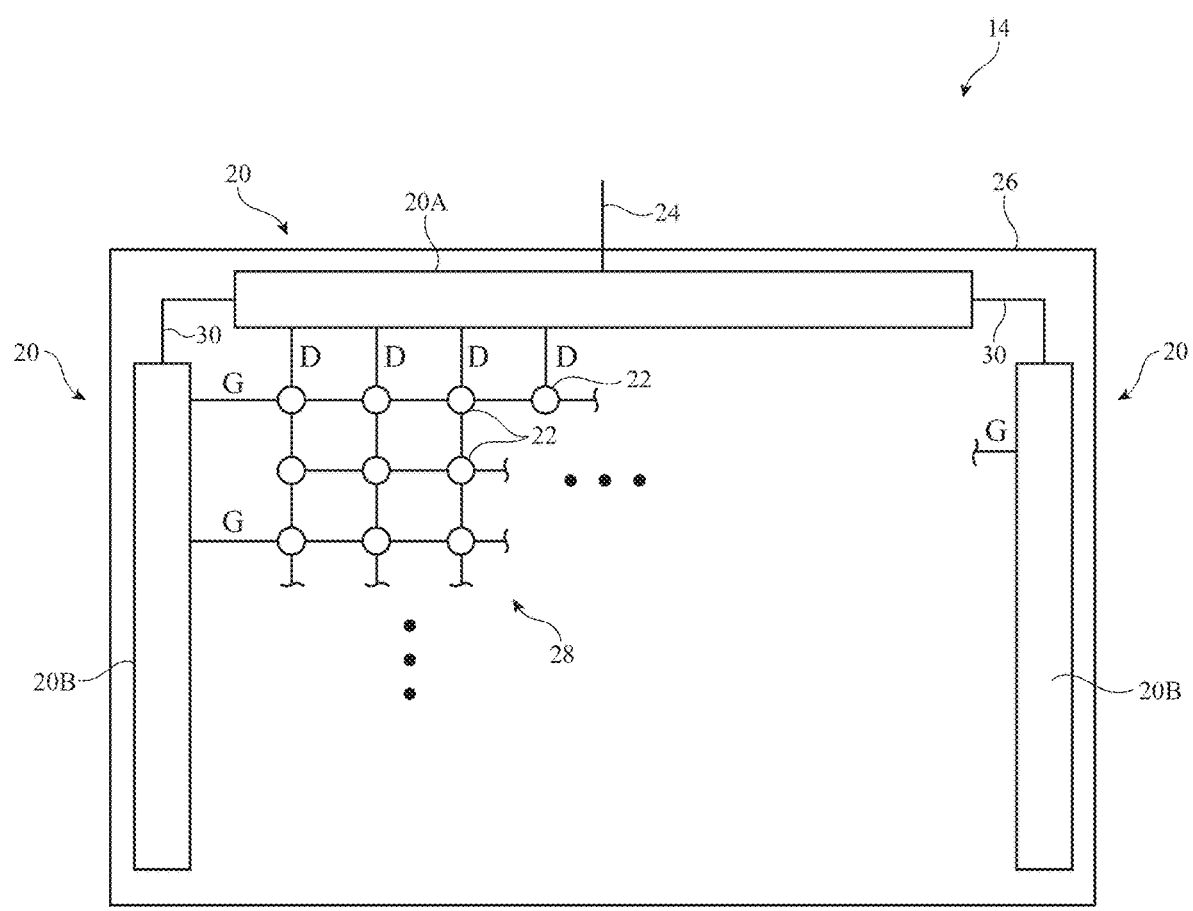
FIG. 2 is a schematic diagram of an illustrative display in accordance with an embodiment.

FIG. 2 is a diagram of an illustrative display 14. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. Pixels of other colors such as cyan, magenta, and yellow might also be used.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally across display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
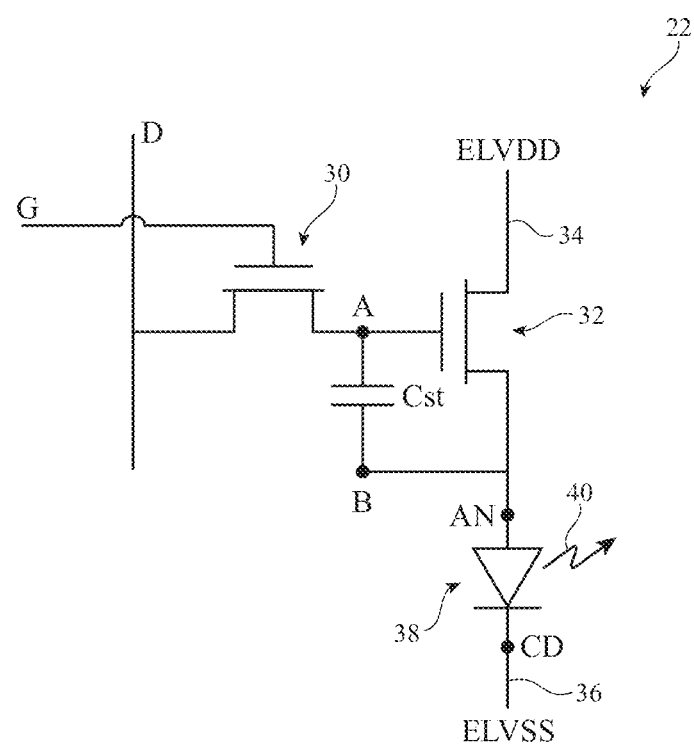
FIG. 3 is a diagram of an illustrative display pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 30. When switching transistor 30 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
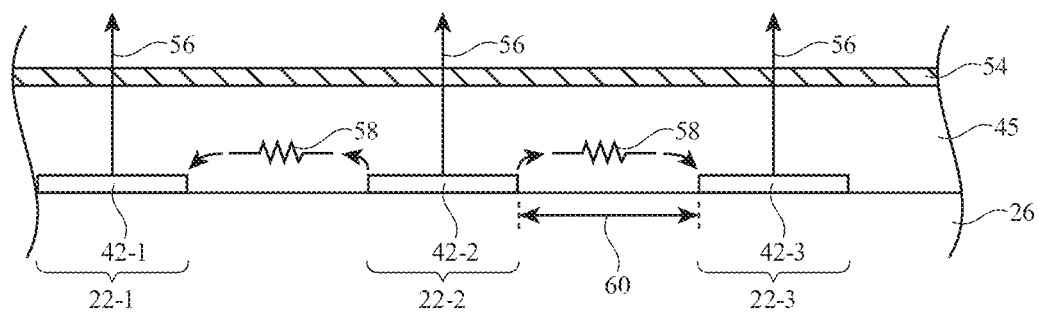
FIG. 4 is a cross-sectional side view of an illustrative organic light-emitting diode display showing lateral leakage current between adjacent anodes in accordance with an embodiment.

FIG. 4 is a cross-sectional side view of an illustrative display with organic light-emitting diode display pixels. As shown, display 14 may include a substrate 26. Substrate 26 may be formed from glass, plastic, polymer, silicon, or any other desired material. Anodes such as anodes 42-1, 42-2, and 42-3 may be formed on the substrate. Anodes 42-1, 42-2, and 42-3 may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an electron-block layer (EBL), an emissive layer (EML), an electron-transport layer (ETL), and an electronic-injection layer (EIL). Cathode 54 may be a conductive layer formed on the OLED layers 45. Cathode layer 54 may form a common cathode terminal (see, e.g., cathode terminal CD of FIG. 3) for all diodes in display 14. Cathode layer 54 may be formed from a transparent conductive material (e.g., indium tin oxide, a metal layer(s) that is sufficiently thin to be transparent, a combination of a thin metal and indium tin oxide, etc.). Each anode in display 14 may be independently controlled, so that each diode in display 14 can be independently controlled. This allows each pixel 22 to produce an independently controlled amount of light.

Anodes 42-1, 42-2, and 42-3 may each be associated with a respective pixel. For example, anode 42-1 may be associated with pixel 22-1, anode 42-2 may be associated with pixel 22-2, and anode 42-3 may be associated with pixel 22-3. To emit light from a pixel, a voltage may applied to the anode of the respective pixel. Take an example in which it is desired to emit light from pixel 22-2 (without emitting light from pixels 22-1 and 22-3). A voltage may be applied to anode 42-2, which causes light 56 to be emitted from pixel 22-2. As previously stated, it would be desirable if no light was emitted from pixels 22-1 and 22-3 as a result of voltage being applied to anode 42-2. However, as shown, leakage may occur through OLED layers 45 between anode 42-2 and anode 42-1, as well as between anode 42-2 and anode 42-3. There may be a lateral resistance 58 (i.e., a resistance associated with the OLED layers) between anode 42-2 and the adjacent anodes that helps prevent leakage. The greater the lateral resistance 58, the less leakage current will reach anodes 42-1 and 42-3. However, resistance 58 may not be large enough to totally eliminate the lateral leakage between anodes 42-2 and 42-1 and between anodes 42-2 and 42-3. As shown in FIG. 4, even though pixels 22-1 and 22-3 are intended to be off, light 56 may be emitted from pixels 22-1 and 22-3.

Although not shown in FIG. 4, display 14 may optionally include a pixel definition layer (PDL). The pixel definition layer may be formed from a non-conducting material and may be interposed between adjacent anodes of the display. The pixel definition layer may have openings in which the anodes are formed, thereby defining the area of each pixel. Each of the following embodiments of an organic light-emitting diode display may optionally include a pixel definition layer.

Figure 5:
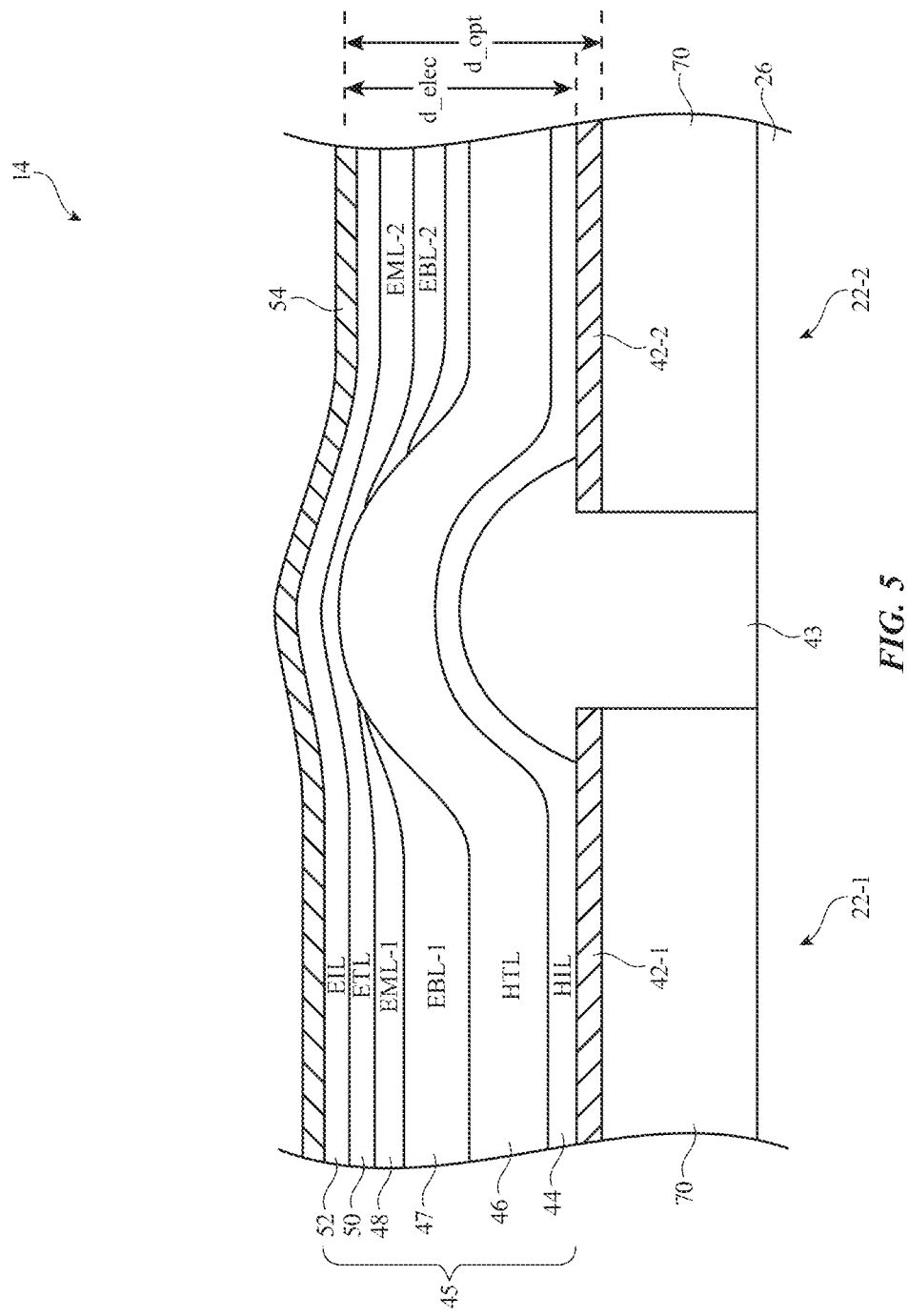
FIG. 5 is a cross-sectional side view of an illustrative organic light-emitting diode display showing different layers of the organic light-emitting diodes in accordance with an embodiment.

FIG. 5 is a cross-sectional side view of an illustrative display with organic light-emitting diode display pixels such as adjacent pixels 22-1 and 22-2. As shown in FIG. 5, each of pixels 22-1 and 22-2 may have a respective reflector structure 70 formed on substrate layer 26. Reflector 70 may be formed from silver, aluminum, other suitable reflective metals, or multi-dialectic coating with high reflection. Anode 42-1 of pixel 22-1 and anode 42-2 of pixel 22-2 may be formed on reflector structures 70. As described above, pixel definition layer (PDL) structure 43 may be interposed between the anodes of adjacent pixels to provide electrical isolation.

Figure 6A:
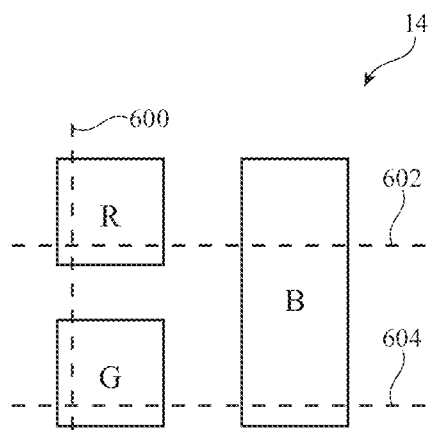
FIGS. 6A-6C show top layout views of various color display configurations in accordance with some embodiments.
Figure 6B:
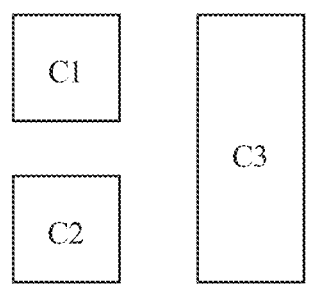
Figure 6C:
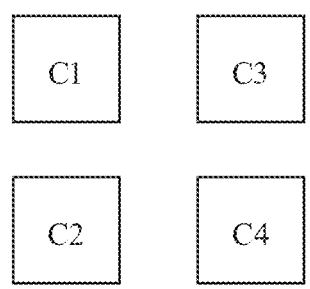

Pixels 22-1 and 22-2 may represent adjacent pixels for any suitable color pattern. FIGS. 6A-6C show top layout views of various color display configurations that can be used. As shown in FIG. 6A, display 14 may have red (R), green (B), and blue (B) display regions, where the blue display region is larger than the red and green display regions. FIG. 5 shows the cross-sectional side view of display 14 cut along line 600, along line 602, or along line 604 (as examples). The arrangement of FIG. 6A is merely illustrative. FIG. 6B shows another suitable color pattern having a first display region of a first color C1, a second display region of a second color C2, and a third display region of a third color C3, where the third display region is larger than the first and second display regions. Colors C1, C2, and C3 can be any suitable color (e.g., red, green, blue, cyan, magenta, yellow, black, white, etc.). FIG. 6C shows yet another suitable color pattern having four different display regions with four respective colors C1-C4, where the four display regions have identical sizes. Similarly, colors C1-C4 can have any suitable color. In general, display 14 may can have any suitable color pattern with display regions of any shape and size.

Referring back to FIG. 5, the OLED layers 45 are formed over the anodes. OLED layers 45 (sometimes referred to as organic layers, an organic stack-up, an organic stack, or an organic light-emitting diode (OLED) stack) may include a hole injection layer (HIL) 44, a hole transport layer (HTL) 46, an electron blocking layer (EBL) 47, an emissive layer (EML) 48, an electron transport layer (ETL) 50, and an electronic injection layer (EIL) 52 interposed between anodes 42 and cathode 54. The hole injection layer 44, hole transport layer 46, and electron block layer 47 underneath EML may collectively be referred to as the hole layers. The electron transport layer 50, and the electron injection layer 52 above EML may collectively be referred to as the electron layers.

As shown, hole layers 44 and 46, ETL layer 50, and EIL layer 52 may be blanket (common) layers that cover the entire array. Emissive layer 48 may include organic electroluminescent material and may be separately patterned for each pixel according to color requirements. In the example of FIG. 5, pixel 22-1 has a first emissive layer EML-1, whereas pixel 22-2 has a separately patterned second emission layer EML-2. Emissive layers EML-1 and EML-2 may be formed from the same or different materials and may have the same or different thicknesses. Similarly, the electron blocking layer 47 may also be individually patterned for each pixel according to the color requirements. As shown in FIG. 5, pixel 22-1 has a first electron blocking layer EBL-1, whereas pixel 22-2 has a separately patterned second electron blocking layer EBL-2. Electron blocking layers EBL-1 and EBL-2 may be formed from the same or different materials and may have the same or different thicknesses. The embodiments here where the EBL-1 and EBL-2 are drawn as non-overlapping is merely illustrative. In general, the electron blocking layers from adjacent pixels may have some amount of overlap over PDL structure 43 due to mask technology and shadow effects.

Ideally, adjacent diodes in display 14 operate independently. In practice, however, the presence of common layers such as hole layers 44, 46, and 47 present an opportunity for leakage current from one diode to flow laterally into an adjacent diode, thereby potentially disrupting the adjacent diode. For example, there is a possibility that the process of applying a drive current between anode 42-1 and cathode 54 will give rise to lateral leakage current through hole layers 44 and 46 (e.g., a current from anode 42-1 to anode 42-2).

The examples of the organic layers included between the anodes 42 and the cathode 54 in FIG. 5 are merely illustrative. If desired, additional layers may be included between anodes 42 and cathode 54 (i.e., a charge generation layer, a hole blocking layer, etc.). In general, any desired layers may be included in between the anodes and the cathode and any layer that is formed across the display may be considered a common lateral conductive layer. Each layer in OLED layers 45 may be formed from any desired material. In some embodiments, the layers may be formed from organic material. However, in some cases one or more layers may be formed from inorganic material or a material doped with organic or inorganic dopants.

Still referring to FIG. 5, display 14 may have an optical cavity that is defined by the distance d_opt between reflector 70 and cathode 54. The optical cavity depth d_opt may be optimized to enhance display efficiency and color purity to help achieve the maximum cavity effect for display 14. On the other hand, display 14 also has an electrical depth hat is defined by the distance d_elec between anodes 42 and cathode. The electrical depth may determine the device performance of pixels 22. In the example of FIG. 5, the electrical depth d_elec and the optical cavity depth d_opt are substantially matched. This configuration may or may not yield the optimal lateral current leakage performance for display 14.

As described above, the hole layers such as layers 44, 46, and 47 may give rise to lateral leakage current between anodes 42-1 and 42-2. Thus, in accordance with an embodiment, the thickness of layers such as HTL layer 46, HIL layer 44, and EBL layer 47 may be reduced to decrease lateral conductance and minimize pixel-to-pixel crosstalk. In the example of FIG. 5, the thickness of hole injection layer 44 is already fairly thin, whereas the thickness of hole transport layer 46 is relatively thicker and can be further reduced.

Figure 7:
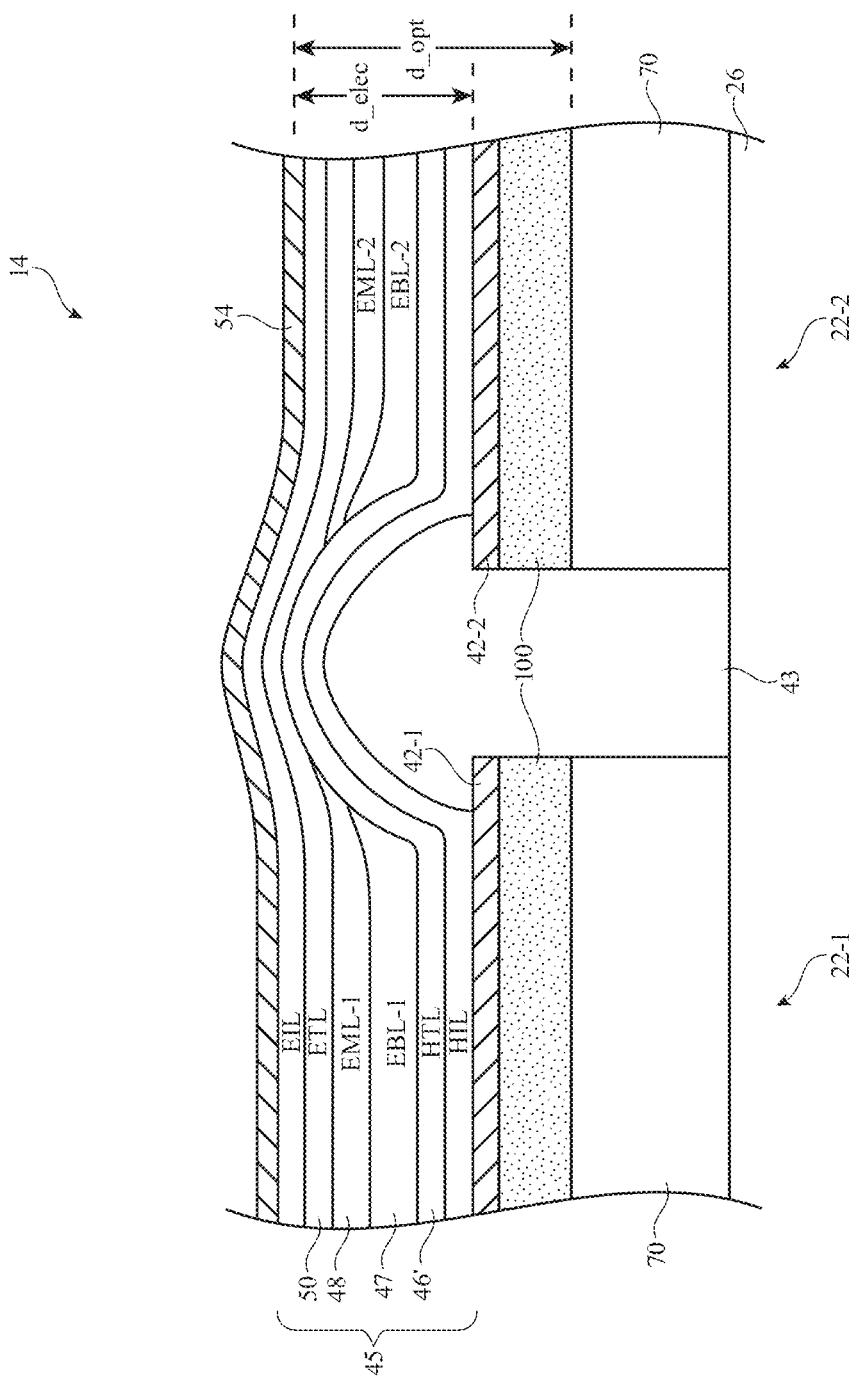
FIG. 7 is a cross-sectional side view of an illustrative organic light-emitting diode display showing how optical spacer structures can be used to separately tune the electrical cavity in accordance with an embodiment.

FIG. 7 is a cross-sectional side view of illustrative organic light-emitting diode display 14 in which the thickness of the blanket/common hole transport layer 46' is reduced. In other words, the thickness of organic layers 45 is collectively reduced. Reducing the thickness of the hole transport layer without making other adjustments would, however, alter the optical cavity distance d_opt from its desired level. Thus, to maintain the desired optical cavity depth d_opt, optical spacers such as optical spacer structures 100 may be inserted between reflector layer 70 and anode layers 42. Optical spacer structures 100 may be formed from silicon oxide ($SiO_2$), silicon nitride (SiNx), indium tin oxide (ITO), polyimide, or other suitable transparent material.

As shown in FIG. 7, due to the insertion of optical spacers 100, the electrical distance d_elec is low noticeably less than optical cavity distance d_opt. This capability of separately tuning distance d_elec independently of distance d_opt allows the designer of display 14 to minimize lateral leakage current between adjacent anodes. Decreasing the thickness of organic conducting layers such as HTL layer 46' in this way increases lateral resistance and decreases vertical resistance, which both help reduce lateral conductance and mitigates undesired pixel-to-pixel crosstalk.

Figure 8:
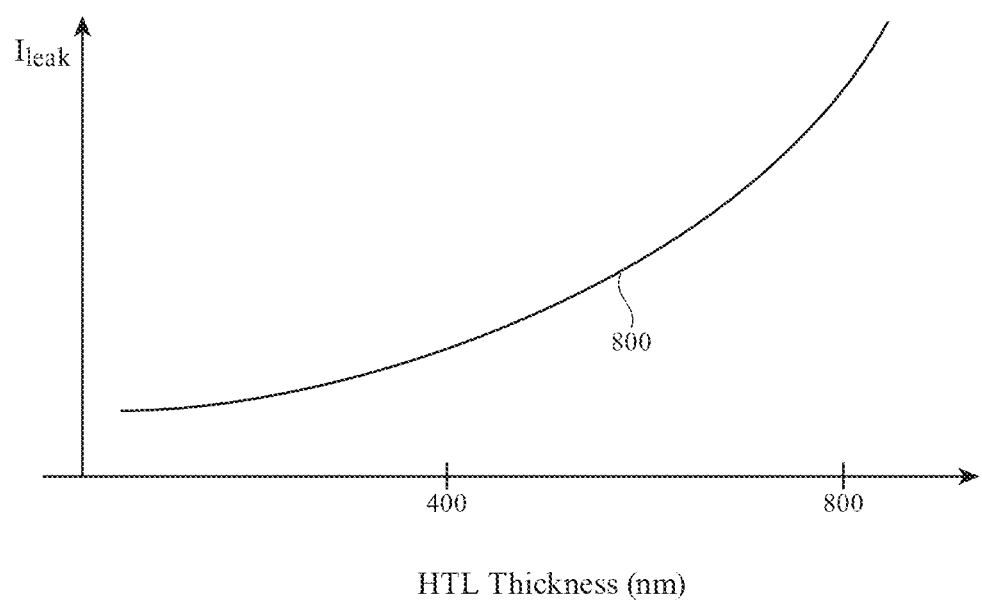
FIG. 8 is a plot illustrating how lateral leakage current can be reduced by lowering the thickness of at least one of the organic layers in accordance with an embodiment.

FIG. 8 is a plot illustrating how lateral leakage current Ileak can be reduced by lowering the thickness of at least one of the organic layers such as the thickness of the hole transport layer. As shown by trace 800 in FIG. 8, lateral leakage current Ileak decreases exponentially as the thickness of the HTL layer is reduced from 800 nm (nanometers) to 400 nm or lower. This leakage current reducing effect might also be true when reducing the thickness of other organic layers such as hole injection layer 44 (if it can be further reduced), and/or electron blocking layer 47 (if it can be further reduced).

The thickness reduction of organic layers 45 also reduces the potential difference between the cathode and the anodes, which helps lower the required driving voltage for the OLED and provides improved power efficiency. Moreover, reducing the thickness of hole transport layer 46' helps increase the resulting hole density in emissive layer 48, which yields higher display efficiency. Similarly, reducing the thickness of electron transport layer 50 can help increase the resulting electron density in emissive layer 48, which also yields higher display efficiency.

Figure 9:
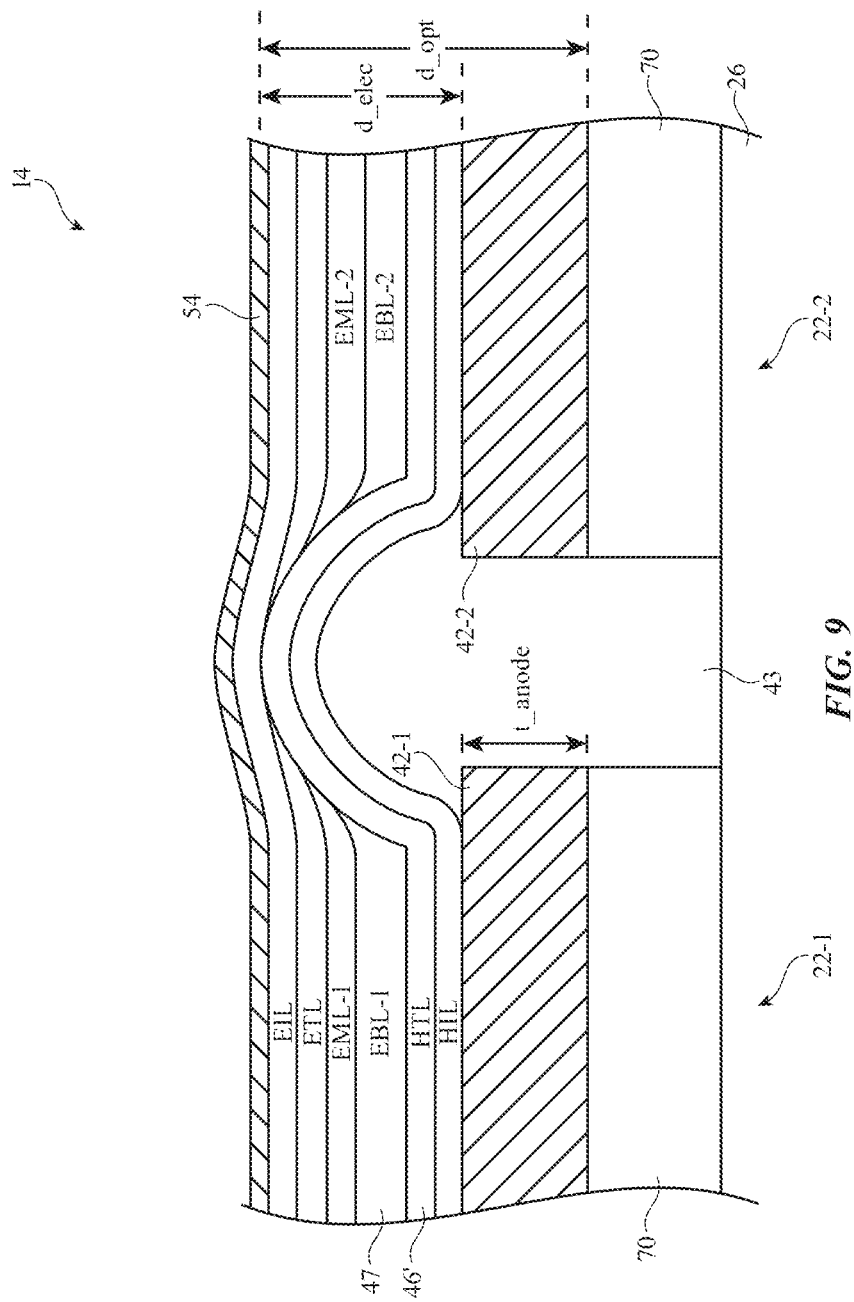
FIG. 9 is a cross-sectional side view of an illustrative organic light-emitting diode display showing how the thickness of the anode layer can be increased to separately tune the electrical cavity in accordance with an embodiment.

The example of FIG. 7 in which the electrical distance d_elec is tuned by inserting optical spacer 100 between the reflector layer and the anode layer is merely illustrative. In accordance with another suitable embodiment, the electrical distance d_elec can be adjusted by tuning the thickness of the anode layer without needing to form any optical spacers. FIG. 9 is a cross-sectional side view of display 14 showing how the thickness of the anode layer can be increased to separately tune the electrical depth. As shown in FIG. 9, anode layer 42-1 of pixel 22-1 and anode layer of pixel 42-2 can have an anode thickness t_anode that can be tuned to help maintain the desired optical cavity distance d_opt. Anode thickness t_anode may be equal to the difference between optical cavity depth d_opt and electrical depth d_elec. Thus, any reduction in the thickness of HTL layer 46' or other organic layers for mitigating lateral leakage current can be compensated by correspondingly increasing anode thickness t_anode.

Figure 10:
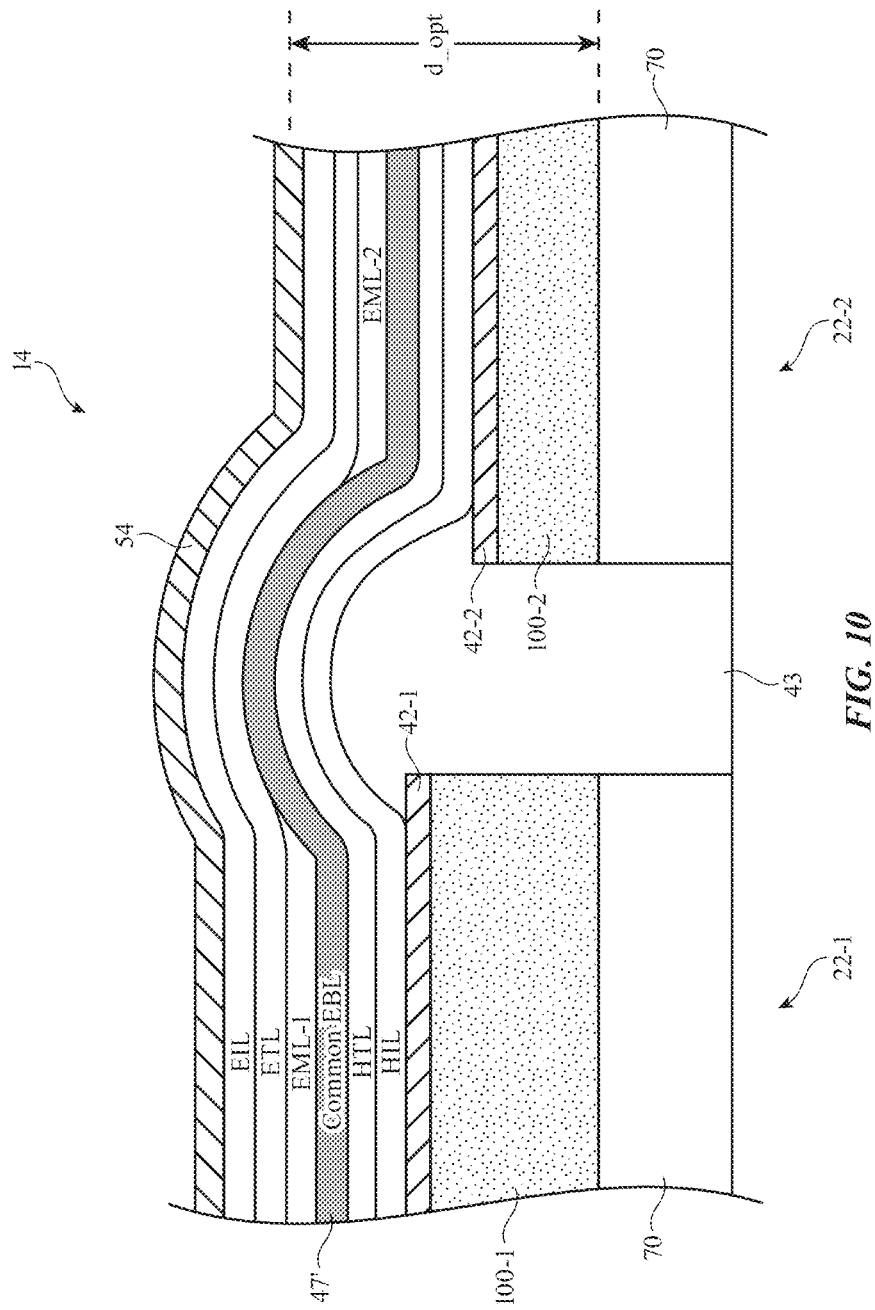
FIG. 10 is a cross-sectional side of an illustrative organic light-emitting diode display showing how optical spacer structures can be selectively patterned to accommodate a common electron blocking layer in accordance with an embodiment.

In the examples of FIG. 7 and FIG. 9, the electron blocking layer 47 for each pixel is separately patterned (e.g., EBL-1 and EBL-2 are formed at different times and may have different thicknesses to help provide the desired optical cavity distance). In accordance with another suitable embodiment, display 14 may be provided with a blanket/common electron blocking layer 47' (see, e.g., FIG. 10). As shown in FIG. 10, common EBL layer 47' may be formed simultaneously over pixels 22-1 and 22-2 using the same material with the same thickness. When a common EBL 47' is used, another layer in the display stackup will have to be adjusted to maintain the desired optical cavity distance. In the example of FIG. 10, the optical spacer structures may be separately patterned to help maintain the desired optical cavity distance. Pixel 22-1 may be provided with a first optical spacer structure 100-1 having a first thickness, whereas pixel 22-2 may be provided with a second optical spacer structure 100-2 having a second thickness that is different than the first thickness. Optical spacers 100-1 and 100-2 may be patterned separately using different optical spacer masks. Configured in this way, the desired optical cavity distance d_opt can be maintained by forming a common EBL layer while reducing lateral leakage.

The example of FIG. 10 in which the optical spacers 100-1 and 100-2 are separately patterned is merely illustrative. If desired, instead of separately patterning the optical spacers like shown in FIG. 10, the anode layers can be separately patterned without needing to form any optical spacers (see, e.g., FIG. 11). FIG. 11 is a cross-sectional side view of display 14 showing how the anode layer can be selectively patterned to accommodate a common electron blocking layer. As shown in FIG. 11, anode layer 42-1' of pixel 22-1 may have a first thickness, whereas anode layer 42-2' of pixel 22-2 may have a second thickness that is different than the first thickness. Anode layers 42-1' and 42-2' may be patterned separately using different anode masks. Formed in this way, the desired optical cavity distance d_opt can be maintained while accommodating a common EBL layer and while reducing lateral leakage.

Figure 12A:
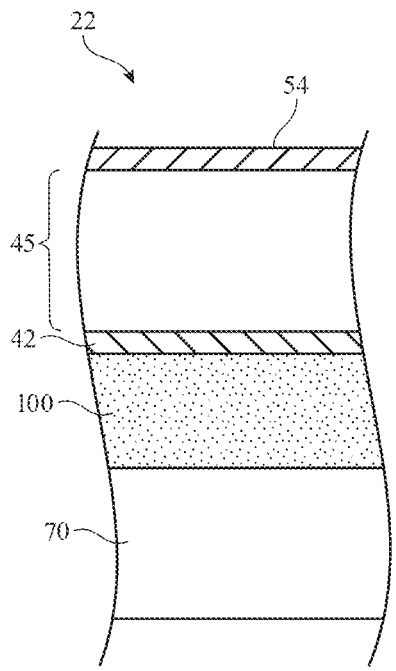
FIG. 12A is a cross-sectional side view of an illustrative organic light-emitting diode display showing an optical spacer layer interposed between the reflector layer and the anode layer in accordance with an embodiment.

FIG. 12A is a cross-sectional side view of a pixel 22 having optical spacer 100 physically interposed between reflector layer 70 and anode layer 42. This is representative of the display stackup shown in FIGS. 7 and 10.

Figure 12B:
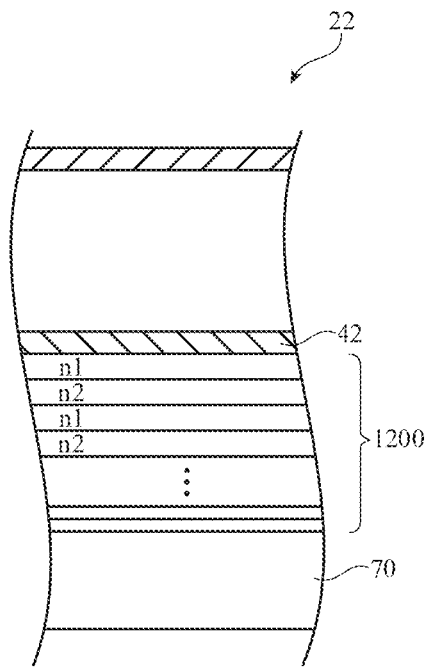
FIG. 12B is a cross-sectional side view of an illustrative organic light-emitting diode display showing a broadband Distributed Bragg Reflector (DBR) structure interposed between the reflector layer and the anode layer in accordance with an embodiment.

FIG. 12B shows another suitable arrangement in which a broadband Distributed Bragg Reflector (DBR) structure such as DBR structure 1200 is interposed between reflector layer 70 and anode layer 42. DBR structure 1200 may be used in any display stackup in place of optical spacer 100, such as in the embodiments of FIGS. 7 and 10 (as examples). The thickness and the material of the anode layer may be selected as part of DBR structure 1200. DBR structure 1200 may include layers of alternating high and low refractive indices n1 and n2 and may be configured to provide high on-axis luminance for display 14. If desired, layers 1200 in different pixels can be formed at the same time (like the optical spacers of FIG. 7) or can be separately patterned (like the optical spacers of FIG. 10) to help enhance the reflectivity of the underlying reflector 70. If desired, a transparent optical spacer structure may be interposed between DBR structure 1200 and the anode layer, where the thickness of the transparent optical spacer structure is selected to provide the predetermined optical cavity distance for the display.

Figure 12C:
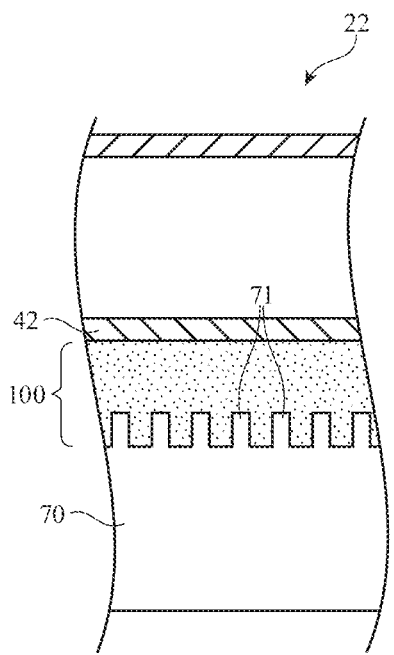
FIG. 12C is a cross-sectional side view of an illustrative organic light-emitting diode display showing how additional grating structures can be formed under the optical spacer layer to improve the emission at targeted viewing angles in accordance with an embodiment.

If desired, additional grating structures such as grating structures 71 may be formed under optical spacer layer 100 to improve the emission at selected display viewing angles (see, e.g., FIG. 12C). As shown in FIG. 12C, grating structures 71 may be configured as fin-like members that protrude from reflector layer 70. Grating fins 71 may be considered a contiguous part of reflector 70.

Figure 12D:
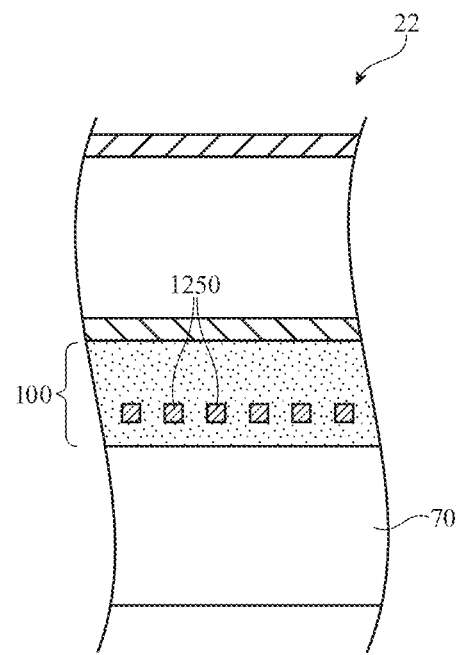
FIG. 12D is a cross-sectional side view of an illustrative organic light-emitting diode display showing how photonic crystal structures can be formed within the optical spacer layer to improve the emission in accordance with an embodiment.
Figure 13:
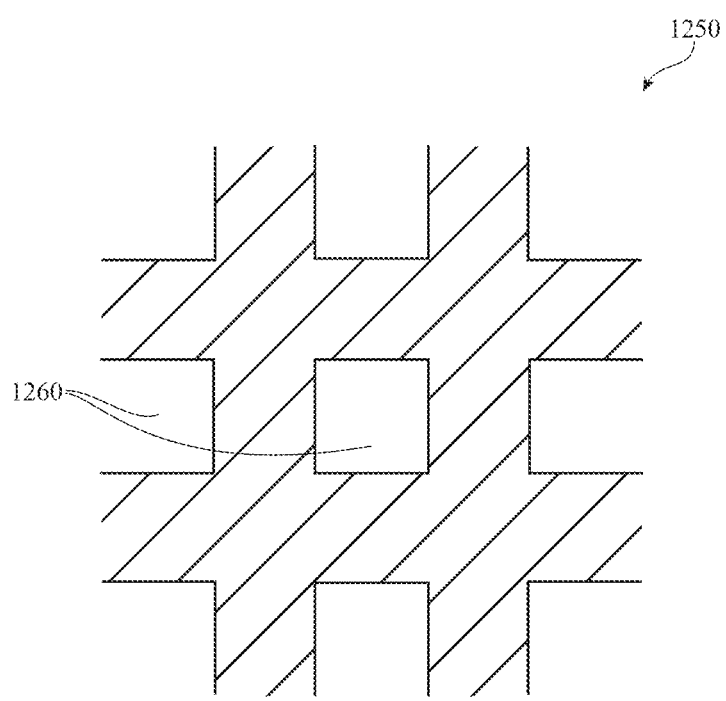
FIG. 13 is a top layout view showing an illustrative grid pattern that is formed by the grating structures shown in FIG. 12C or the photonic crystal structures shown in FIG. 12D in accordance with an embodiment.

If desired, photonic crystal structures such as photonic crystal structures 1250 may be formed within optical spacer layer 100 to help improve the emission at desired viewing angles (see, e.g., FIG. 12D). As shown in FIG. 12D, photonic crystal structures 1250 may be formed using titanium oxide ($TiO_2$) or in general, any (non)dielectric material with a different refractive index than optical spacer 100. Photonic crystal structures 1250 and optionally grating structures 71 may form a grid-like or matrix patterned when viewed from above, as shown in the top layout view of FIG. 13. As shown in FIG. 13, photonic crystal grid 1250 may have openings 1260 through which the optical spacer material may be formed. The examples of FIGS. 12A-12D are merely illustrative and are not intended to limit the scope of the present embodiments. In general, any desired display enhancing structures may be formed as part of optical spacer layer 100 or between anode layer 42 and reflector 70.

The foregoing is merely illustrative and various modifications can be made by those skilled in the art without departing from the scope and spirit of the described embodiments. The foregoing embodiments may be implemented individually or in any combination.

What is claimed is:

1. A display comprising:
   a cathode;
   an anode;
   organic light-emitting diode (OLED) layers formed between the cathode and the anode, wherein the organic light-emitting diode layers comprise electron layers having a first thickness and a hole transport layer having a second thickness less than the first thickness and minimized, directly over the anode, to reduce leakage current in the display;
   a reflector layer, wherein the anode has a top surface facing the cathode and a bottom surface facing the reflector layer;
   an additional anode; and
   an additional reflector layer, wherein the anode and the additional anode have different thicknesses.

2. The display of claim 1, wherein the hole transport layer has a minimum thickness allowed by a process used to manufacture the display.

3. The display of claim 2, wherein the organic light-emitting diode layers further comprise a hole injection layer having a minimum thickness allowed by the manufacturing process or an electron blocking layer having a minimum thickness allowed by the manufacturing process.

4. The display of claim 1, further comprising:
   a Distributed Bragg Reflector (DBR) structure interposed between the reflector layer and the anode, wherein the DBR structure is configured to enhance the reflectivity of the reflector layer, and wherein the thickness and material of the anode is selected as part of the DBR structure.

5. The display of claim 1, wherein the thickness of the anode is selected to provide a predetermined optical cavity distance for the display.

6. The display of claim 1, wherein the anode is part of a first pixel and wherein the additional anode is part of a second pixel, further comprising:
   a common electron blocking layer that is formed over the anode in the first pixel and the additional anode in the second pixel;
   a first emissive layer formed as part of the first pixel; and
   a second emissive layer formed as part of the second pixel.

7. A method of forming a display, comprising:
   obtaining a substrate;
   forming a reflector layer on the substrate;
   forming a cathode;
   forming an anode having a top surface facing the cathode and a bottom surface facing the reflector layer;
   forming an additional anode having a different thickness than the anode;
   forming an additional reflector layer under the additional anode; and
   forming organic layers between the cathode and the anode, wherein forming the organic layers comprises:
      forming electron layers having a first thickness; and
      forming a hole transport layer having a second thickness less than the first thickness and minimized, directly over the anode, to reduce lateral leakage current.

8. The method of claim 7, wherein the anode is part of a first pixel and wherein the additional anode is part of a second pixel, the method further comprising:
   simultaneously forming a common electron blocking layer over the anode of the first pixel and the additional anode of the second pixel.

9. The method of claim 7, wherein the anode is part of a first pixel, wherein the additional anode is part of a second pixel, and wherein the anode of the first pixel and the additional anode of the second pixel are separately patterned using different anode masks.

10. The method of claim 7, wherein the anode is part of a first pixel and wherein the additional anode is part of a second pixel, the method further comprising:
    forming a plurality of organic layers simultaneously over the anode in the first pixel and the additional anode in the second pixel.

11. An electronic device, comprising:
    control circuitry; and
    a display, wherein the display comprises:
       a cathode;
       an anode;
       a reflector; and
       a hole transport layer between the anode and the cathode, wherein the hole transport layer has a minimal thickness, directly over the anode, optimized to reduce leakage current in the display; and
       transparent optical spacers sandwiched between the anode and the reflector and having different thicknesses in adjacent pixels of the display.

12. The electronic device of claim 11, wherein the display further comprises a common electron blocking layer formed over the adjacent pixels.

13. The electronic device of claim 11, wherein the display further comprises:
    organic layers formed between the cathode and the anode, wherein all of the organic layers are simultaneously formed over the adjacent pixels.

* * * * *